United States Patent [19]

Tubbs

[11] 4,350,992

[45] Sep. 21, 1982

[54] N-CHANNEL SILICON GATE VIRTUAL GROUND ROM

[75] Inventor: Graham S. Tubbs, Houston, Tex.

[73] Assignee: Texas Instruments Incorporated, Dallas, Tex.

[21] Appl. No.: 82,247

[22] Filed: Oct. 5, 1979

[51] Int. Cl.³ .................. H01L 27/10; G11C 11/40
[52] U.S. Cl. .................. 357/23; 365/104; 357/41; 357/45; 357/59
[58] Field of Search .............. 365/104; 357/45, 41, 357/59, 23, 23 S, 23 CS

[56] References Cited

U.S. PATENT DOCUMENTS

| | | | |
|---|---|---|---|
| 4,021,781 | 5/1977 | Caudel | 364/900 |
| 4,151,020 | 4/1979 | McElroy | 357/41 |
| 4,207,585 | 6/1980 | Rao | 357/45 |
| 4,219,836 | 8/1980 | McElroy | 357/45 |

Primary Examiner—William D. Larkins
Attorney, Agent, or Firm—John G. Graham

[57] ABSTRACT

An MOS read only memory or ROM of small cell size is formed by a process compatible with standard N-channel silicon gate ROM manufacturing methods.

In an array of rows and columns of the cells, the row address lines and gates are polysilicon, and column lines forming output and ground are defined by elongated N+ regions which are partly diffused and partly implanted since the column lines cross beneath the polysilicon row address strips. Each potential MOS transistor in the array is programmed to be a logic "1" or a "0" by the presence or absence of moat beneath the gate of a cell.

10 Claims, 11 Drawing Figures

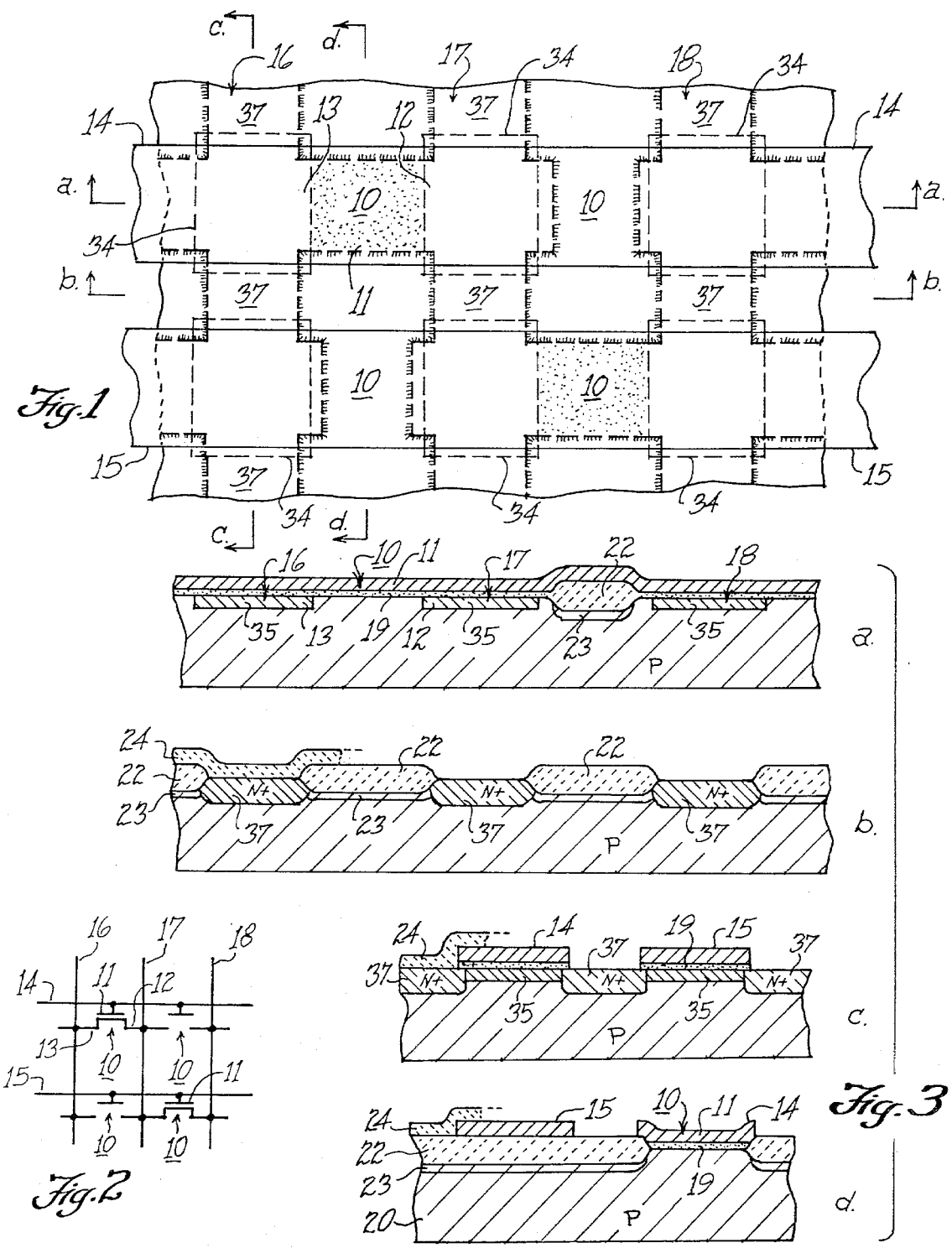

N-CHANNEL SILICON GATE VIRTUAL GROUND ROM

BACKGROUND OF THE INVENTION

This invention relates to semiconductor memory devices, and more particularly to an N-channel silicon gate MOS read only memory and a process for making it.

Semiconductor memory devices are widely used in the manufacture of digital equipment such as minicomputers and microprocessor systems. Storage of fixed programs is usually provided in these systems by MOS read only memory devices or "ROMs". The economics of manufacture of ROMs, and of mounting them on circuit boards in the system, are such that the number of memory bits per semiconductor chip is advantageously as high as possible. ROMs of up to 32 K bits (32768) are typical at present. Within a few years, standard sizes will progress through 64 K, 128 K, 256 K and 1 megabit. This dictates that cell size for the storage cells of the ROM be quite small. Metal gate ROMs of small size can be relatively easily fabricated in the manner set forth in U.S. Pat. No. 3,541,543, assigned to Texas Instruments; these are usually programmed by the gate level mask. Most microprocessor and computer parts are now made by the N-channel silicon gate process because of the shorter access times provided. In the past, the N-channel process has not been favorable to layout of ROM cells of small size. N-channel ROMs are disclosed in prior applications Ser. No. 762,612, filed Jan. 29, 1977 and Ser. No. 701,932, filed July 1, 1976, assigned to Texas Instruments. A method of programming a ROM by ion implant prior to forming the polysilicon gate is shown in U.S. Pat. No. 4,059,826 to Gerald D. Rogers, assigned to Texas Instruments. Also, previous cells have been programmed at the metal level mask by contact areas between metal lines and polysilicon gates, or by contacts between metal lines and N+ source or drain regions, using excessive space on the chip.

Methods of programming N-channel ROMs by implant through polysilicon gates are shown in prior applications of C-K Kuo, Ser. No. 890,555, Ser. No. 890,556, Ser. No. 890,557, filed Mar. 20, 1978, Ser. No. 900,549, filed Apr. 27, 1978, and of Kuo and Tsaur, Ser. No. 907,236, filed May 18, 1978, all assigned to Texas Instruments. These methods required that no metal overlie the gates and thus "SATO" type processing was used so that no metal was in the ROM array.

It is the principal object of this invention to provide a semiconductor permanent store memory cell of small size which uses a process compatible with the standard high volume N-channel silicon gate process. Another object is to provide a small-area MOS ROM cell which is made by a process compatible with the standard N-channel self-aligned silicon gate manufacturing process and yet allows N+ conductor strips to pass under polysilicon strips without forming gates or contacts.

SUMMARY OF THE INVENTION

In accordance with an embodiment of the invention, an MOS read only memory or ROM of small cell size is formed by a process compatible with standard N-channel silicon gate ROM manufacturing methods.

In an array of rows and columns of the cells, the row address lines and gates are polysilicon, and column lines forming output and ground are defined by elongated N+ regions which are partly diffused and partly implanted since the column lines cross beneath the polysilicon row address strips. Each potential MOS transistor in the array is programmed to be a logic "1" or "0" by the presence or absence of moat beneath the gate of a cell.

BRIEF DESCRIPTION OF THE DRAWINGS

The novel features believed characteristic of the invention are set forth in the appended claims. The invention, itself, however, as well as other features and advantages thereof, will be best understood by reference to the detailed description which follows, read in conjunction with the accompanying drawings, wherein:

FIG. 1 is a greatly enlarged plan view of a small portion of a semiconductor chip showing the physical layout of a part of a ROM array made according to the invention;

FIG. 2 is an electrical schematic diagram of the ROM of FIG. 1;

FIGS. 3a–3d are elevation views in section of the cell of FIG. 1, taken along the lines a—a, b—b, c—c, and d—d, respectively.

DETAILED DESCRIPTION OF SPECIFIC EMBODIMENTS

Figure 4:
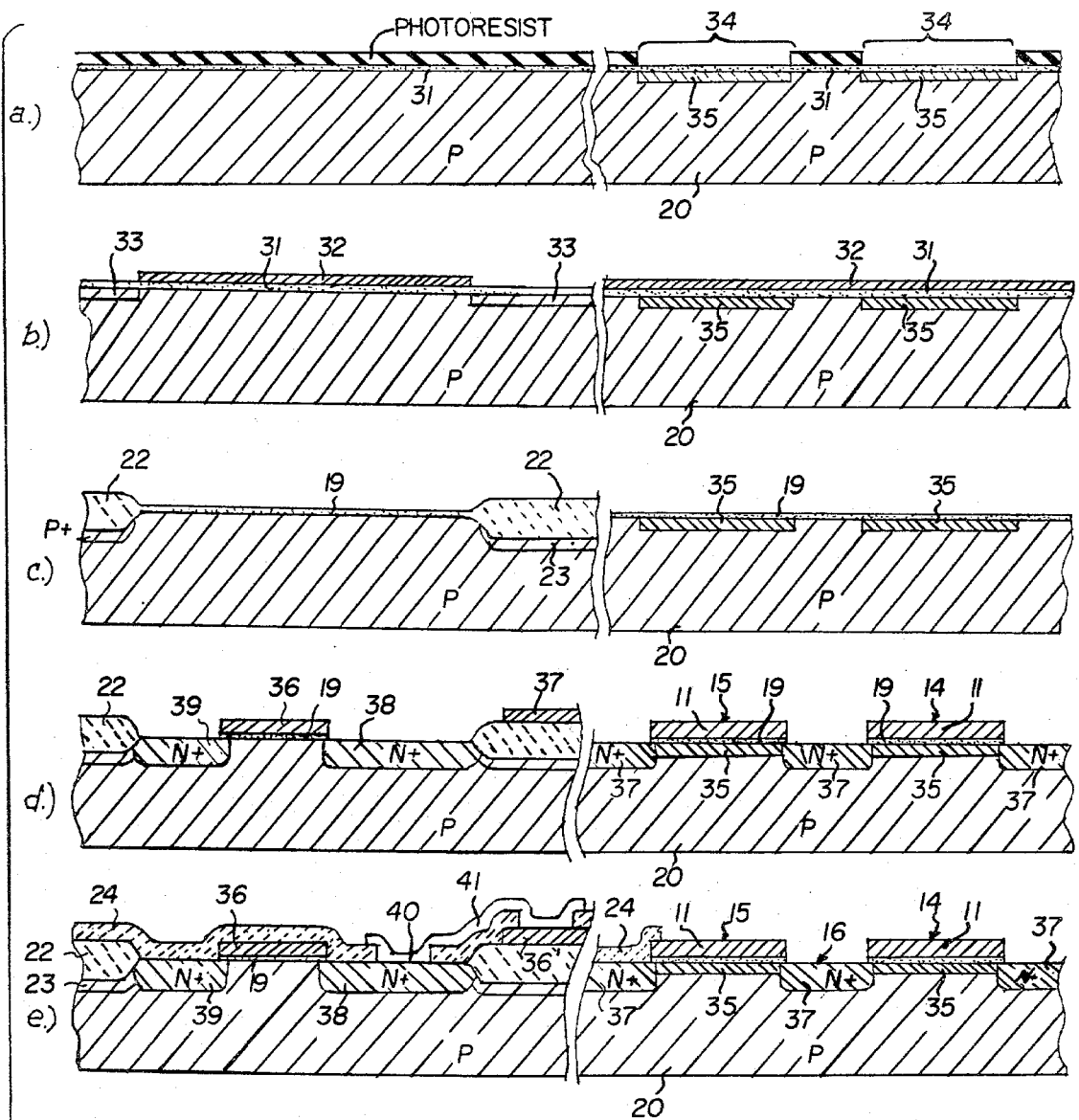
FIGS. 4a–4e are elevation views in section of the ROM array and a transistor in the peripheral part of the semiconductor device of FIGS. 1 and 3a–3d, at successive steps in the manufacturing process, taken generally along the line c—c in FIG. 1.

With reference to FIGS. 1, 2, and 3a–3d, a read only memory is illustrated which is made according to the invention. The array consists of a large number of cells 10, only four of which are shown. Each cell is a potential MOS transistor having a gate 11 and source and drain regions 12 and 13. The gates 11 are parts of polysilicon strips 14 and 15 which are the X address lines for the array. The sources or drains are part of N+ regions 16, 17, and 18, which are connected to output or ground, providing Y output lines. The array, formed on a silicon bar 20, would typically contain perhaps 64 K, 128 K or 256 K cells, so the bar would be less than about 200 mils on a side or 40,000 sq. mil area depending upon the bit density. The four cells 10 shown would be on a minute part of the bar, perhaps one or two mils wide. A 64 K ROM would require 256 of the X address lines such as 14 and 15 and 257 of the Y lines like the lines 16, 17, and 18, providing 65,536 bits.

The cell array is programmed by either forming or not forming the moat regions under the gates 11 or under the polycrystalline silicon strips 14 and 15; where the moat is formed, thin gate oxide 19 provides a threshold voltage of the selected ones of the cells 10 of a value which will allow the transistor to be turned on by a logic "1" voltage on the selected address line 14, 15, etc. In the example of four cells shown, the upper left cell and the lower right cell are programmed to have the moat in place in this manner, the others are not. The upper right and lower left have thick field oxide 22 under the gate so a logic "1" voltage of +5 V will not cause conduction from source to drain.

A thick field oxide coating 22 covers parts of the bar not occupied by the transistors or diffused interconnects, and P+ channel stop regions 23 are formed underneath all the thick field oxide. An interlevel oxide coating 24 is provided between the polysilicon strips 14, 15 and metal strips in the peripheral circuitry; metal is not used in the cell array.

A thick protective oxide layer (not shown) covers the metallization, with aperatures etched in this layer above bonding pads. This layer is non-thermal oxide deposited at low temperature in accord with standard MOS manufacturing methods. Usually this oxide covers everything except the bonding pads on a bar.

Turning now to FIGS. 4a–4e, a process for making the ROM array of the invention will be described. The right hand side of these FIGURES corresponds to the section view of FIG. 3c, while the left hand side shows the formation of an N-channel silicon gate transistor of conventional form on the periphery of the chip, i.e., not in the cell array. The starting material is a slice of P-type semiconductor grade monocrystalline silicon, typically 3 inches in diameter, cut on the <100> plane, of high resistivity. As above, in the FIGURES the portion shown of the bar 20 represents only a very small undivided part of the slice, perhaps one or two mils wide for each part. After appropriate cleaning, the slice is oxidized by exposing to oxygen in a tube furnace at an elevated temperature to produce an oxide layer 31 over the entire slice of a thickness of about 1000 Angstroms.

According to the invention a photoresist coating is applied and exposed through a mask which defines what are to be N+ regions in the lines 16–18 beneath the poly strips 14 and 15. These areas 34 are oversized, and may indeed form continuous strips running along the strips 16–18. With the resist as a mask, an N+ implant of phosphorus at 200 keV forms the N+ regions 35, seen in FIG. 4a. This implant can be done after the field oxide 22 is grown (see FIG. 4c) instead of first (FIG. 4a).

Referring to FIG. 4b, next a layer 32 of silicon nitride of about 1000 Angstroms thickness is formed over the entire slice by exposing to an atmosphere of dichlorosilane and ammonia in a CVD reactor. A coating of photoresist is applied to the entire top surface of the slice, then exposed to ultraviolet light through a mask which defines the desired pattern of the thick field oxide 22 and the P+ channel stop 23. This is the programming mask. The resist is developed, leaving areas where nitride is then etched away by a nitride etchant, removing the exposed part of the nitride layer 32 but leaving in place the oxide layer 31; the nitride etchant does not react with the photoresist.

Using the photoresist and nitride as a mask, the slice is now subjected to an ion implant step to produce the channel stop regions 23, whereby boron atoms are introduced into unmasked regions 33 of silicon. The oxide layer 31 is left in place during the implant because it prevents the implanted boron atoms from out-diffusing from the surface during subsequent heat treatment. This implant is at a dosage of about $10^{13}$ per sq. cm at 150 KeV. The regions 33 do not exist in the same form in the finished device, because some of this part of the slice will have been consumed in the field oxidation procedure. After implant, the slice is subjected to a heat treatment prior to field oxide growth, as set forth in U.S. Pat. No. 4,055,444, assigned to Texas Instruments.

The next step in the process is formation of field oxide 22, which is done by subjecting the slices to steam or an oxidizing atmosphere at about 1000 degrees C. for perhaps several hours. This causes a thick field oxide region or layer 22 to be grown as seen in FIG. 4c. This region extends into the silicon surface because silicon is consumed as it oxidizes. The remaining parts of the nitride layer 32 mask oxidation. The thickness of this layer 22 is about 10,000 Angstroms, about half of which is above the original surface and half below. The boron doped P+ regions 33 formed by implant will be partly consumed, but will also diffuse further into the silicon ahead of the oxidation front. Thus, P+ field stop regions 23 will result which will be much deeper than the original regions 33.

Next the remaining nitride layer 32 is removed by an etchant which attacks nitride but not silicon oxide, then the oxide 31 is removed by etching and the exposed silicon cleaned. The gate oxide 19 is grown by thermal oxidation to a thickness of about 500 to 800 Angstroms. In areas of the slice where depletion load devices are required, although not pertinent to this invention, a masked ion implant step would be done at this point. Likewise, the threshold voltage of the enhancement made transistors in the ROM array or periphery may be adjusted by ion implant. Also, windows for polysilicon to silicon contacts, if needed, are patterned and etched at this point using photoresist; none are needed in the ROM array itself or the peripheral transistor shown.

As seen in FIG. 4d a layer of polycrystalline silicon is deposited over the entire slice in a reactor using standard techniques, to a thickness of about 5000 Angstroms. This layer is doped with phosphorus by the later N+ diffusion to make it highly conductive. The polysilicon layer is patterned by applying a layer of photoresist, exposing to ultraviolet light through a mask prepared for this purpose, developing to expose oxide, then etching away the exposed oxide. The remaining photoresist masks the gate areas of the polysilicon and the lines 14 and 15, as well as the gates 36 of peripheral transistors and inter-connection 36' or other parts of the circuit on the chip. The unmasked polycrystalline silicon is etched away, so the resulting structure seen in FIG. 4d includes a part of the remaining polysilicon layer which provides what will be a gate 36 of a peripheral N-channel MOS transistor, the gates 11 in the ROM array, as well as the line 14. The thin oxide 19 underneath the gate area 36 is the gate oxide of the transistor. Parts of the output lines 16–18 will be exposed, but the sources and drains 12 and 13 and other regions beneath the polysilicon lines 14 and 15 will be covered; this is the reason that the phosphorus implant in the areas 34 is necessary, according to the invention. The slice is next subjected to a standard N+ diffusion whereby the N+ regions are formed using the gate oxide 19 and the field oxide 22 as a diffusion mask. This forms N+ regions 37 which complete the Y lines 16–18 in the gaps, as well as source and drain regions 38 and 39 for the peripheral transistor.

A layer 24 of silicon oxide is deposited by decomposition of silane at a low temperature, about 400 degrees C. This layer insulates the metal level from the polycrystalline silicon level of interconnections and gates and is referred to as multilevel oxide. The multilevel oxide layer 24 is patterned by a photoresist operation, exposing contact area 40 for a metal-to-silicon contact, as well as contact areas for metal contacts and interconnections used in the periphery of the chip in the input buffers, decoders, sense amplifiers, substrate pump, and the like.

The metal contacts and interconnections are made in the usual manner by depositing a thin film of aluminum over the entire top surface of the slice then patterning it by a photoresist mask and etch sequence. This leaves metal strips where needed in the periphery, such as a strip 41 connecting the source 38 of the N-channel silicon gate peripheral transistor to a contact area at one end 36′ of the polysilicon X address line 14 as seen in FIG. 4e.

In operation, the X address selects one of the lines 14 or 15, or one of the other of the 256 such lines in a 64 K ROM, and this selected line is held at logic "1" level or about +5 V. The remaining lines are held at Vss, logic "0". The Y address selects one of the 257 lines such as 16, 17 or 18 and this line is connected via the Y decoder to the output. An adjacent one of the Y lines such as lines 16–18 is connected to ground, providing a virtual ground ROM as set forth in U.S. Pat. Nos. 3,934,233, issued to Fisher and Rogers or 4,021,781 issued to Caudel, both assigned to Texas Instruments. For dynamic ROMs, the Y lines usually would be precharged prior to an access cycle, so the selected line will conditionally discharge depending upon whether the selected bit at the intersection of the addressed X and Y lines is programmed a 1 or a 0.

The purpose or presence or absence of the moat under some gates 11 cell array is to change the threshold voltage of some of the transistors 10 relative to the others, depending upon whether a 1 or a 0 is to be stored. A ROM cell can be either normally on or normally off when selected. The feature of this invention can be used in either P-channel or N-channel ROMs, so, depending on channel type and whether the cells are to be normally on or normally off when selected, the proper type can be determined by ion implant. In the embodiment described in detail above, the threshold voltage is such that a transistor 10 is on when selected. The normally on device can be either enhancement or depletion mode. In another example, such as series ROM of U.S. Pat. No. 4,059,826 mentioned above, the ion implant would lower the threshold to depletion mode.

While this invention has been described with reference to illustrative embodiments, this description is not intended to be construed in a limiting sense. Various modifications of the illustrative embodiments, as well as other embodiments of the invention, will be apparent to the persons skilled in the art upon reference to this description. It is, therefore, contemplated that the appended claims will cover any such modifications or embodiments as fall within the true scope of the invention.

What is claimed is:

1. A read only memory array comprising:
    a plurality of memory cells formed at a face of a silicon body in an array of rows and columns;
    each memory cell including an insulated gate field effect transistor having a source, a drain and a polysilicon gate, the gate being insulated from the silicon by a thin gate insulator for selected ones of the memory cells; and
    interconnections to the sources and drains formed by column lines partially underlying row lines on the face, the row lines being polysilicon strips generally perpendicular to the column lines and forming said gates, thick field oxide underlying the gate for remaining memory cells other than said selected ones of the memory cells to alter substantially the threshold of the transistors of such remaining cells compared to the transistors of said selected ones of the memory cells, the thick field oxide extending into said face to a depth greater than that of said thin gate insulator, said column lines including diffused regions self-alligned with the row lines and heavily doped implanted regions underlying the row lines and extending out from beneath the row lines to spaces between the rows lines, the diffused regions and the implanted regions together creating continuous conductive paths to form the column lines, the thick field oxide being formed in said face between the column lines but not overlying the column lines.

2. A device according to claim 1 wherein the transistors are N-channel silicon gate transistors.

3. A device according to claim 2 wherein the silicon body is P-type, the sources and drains are N-type, and the implanted regions are N-type.

4. A device according to claim 3 wherein the sources and drains are parts of the implanted regions.

5. A device according to claim 4 wherein the array is of the virtual ground type.

6. A device according to claim 5 wherein a plurality of N-channel silicon gate transistors with diffused source and drain regions are formed peripheral to the array.

7. An integrated semiconductor device comprising:
    a plurality of cells formed at a face of a semiconductor body in an array of rows and columns;
    each of the cells including an insulated gate field effect transistor having a source, a drain and a gate, the gate being insulated from the face of the semiconductor body by a thin gate insulator for at least selected ones of the cells;
    interconnections to the sources and drains formed by column lines in the face partially underlying the row lines;
    the row lines being polysilicon strips extending along said face generally perpendicular to the column lines and forming the gates;
    said column lines including diffused regions in the face self-alligned with the row lines in the space between row lines along with implanted regions in the face beneath the row lines overlapping the diffused regions, the diffused regions and implanted regions together creating continuous conductive paths; and thick field oxide much thicker than said thin gate insulator formed in said face between said column lines but not over said column lines, the thick field oxide extending into said face to a depth greater than that of said thin gate insulator; and
    wherein the cells are read-only-memory cells and some of the transistors have thick field oxide beneath the gates.

8. A device according to claim 7 wherein the transistors are N-channel silicon gate transistors, the body is P-type silicon, the sources and drains are N-type, and the implanted regions are N-type.

9. A device according to claim 8 wherein the sources and drains are parts of the implanted regions.

10. A device according to claim 7 wherein the array is of the virtual ground type.

* * * * *